United States Patent
Ryu et al.

(10) Patent No.: US 9,595,439 B2
(45) Date of Patent: Mar. 14, 2017

(54) METHOD FOR PREPARING NANOSTRUCTURE BY ELECTROCHEMICAL DEPOSITION, AND NANOSTRUCTURE PREPARED THEREBY

(71) Applicant: INJE UNIVERSITY INDUSTRY-ACADEMIC COOPERATION FOUNDATION, Gyeongsangnam-do (KR)

(72) Inventors: Hyuk Hyun Ryu, Busan (KR); Jin Tak Jang, Gyeongsangbuk-do (KR); Tae Gyoum Kim, Gyeongsangnam-do (KR)

(73) Assignee: INJE UNIVERSITY INDUSTRY-ACADEMIC COOPERATION FOUNDATION, Gyeongsangnam-Do (KR)

( * ) Notice: Subject to any disclaimer, the term of this patent is extended or adjusted under 35 U.S.C. 154(b) by 0 days.

(21) Appl. No.: 14/646,448

(22) PCT Filed: Apr. 23, 2014

(86) PCT No.: PCT/KR2014/003543
§ 371 (c)(1),
(2) Date: May 21, 2015

(87) PCT Pub. No.: WO2014/175653
PCT Pub. Date: Oct. 30, 2014

(65) Prior Publication Data
US 2015/0275386 A1    Oct. 1, 2015

(30) Foreign Application Priority Data

Apr. 23, 2013 (KR) .................. 10-2013-0044522
Mar. 21, 2014 (KR) .................. 10-2014-0033653

(51) Int. Cl.
| | |
|---|---|
| H01L 21/02 | (2006.01) |
| H01L 29/06 | (2006.01) |
| H01L 29/22 | (2006.01) |
| B82B 3/00 | (2006.01) |
| C25D 9/08 | (2006.01) |
| C25D 21/12 | (2006.01) |

(52) U.S. Cl.
CPC ...... *H01L 21/02628* (2013.01); *B82B 3/0014* (2013.01); *C25D 9/08* (2013.01); *C25D 21/12* (2013.01); *H01L 21/02422* (2013.01); *H01L 21/02491* (2013.01); *H01L 21/02554* (2013.01); *H01L 21/02603* (2013.01); *H01L 29/0669* (2013.01); *H01L 29/22* (2013.01)

(58) Field of Classification Search
CPC . C25D 9/06; C25D 7/12; C25D 17/10; C25D 3/22; H01L 29/0669; H01L 29/22; H01L 21/02554; H01L 21/02603; H01L 21/02491; H01L 21/02422; H01L 21/02628; B82B 3/0014
USPC .............................. 257/43; 205/162
See application file for complete search history.

(56) References Cited

U.S. PATENT DOCUMENTS

| | | | | |
|---|---|---|---|---|
| 6,896,785 | B2 * | 5/2005 | Shatrov ............... | C25D 5/18 204/164 |
| 2003/0188972 | A1 * | 10/2003 | Shatrov ............... | C25D 5/18 205/91 |
| 2009/0011224 | A1 * | 1/2009 | Nagarajan ............ | C25D 1/01 428/328 |
| 2012/0000783 | A1 * | 1/2012 | Suda ................... | C25D 11/04 205/50 |

FOREIGN PATENT DOCUMENTS

| | | | |
|---|---|---|---|
| JP | 2005-521794 | * | 7/2005 |
| JP | 2005-521794 A | | 7/2005 |
| KR | 10-2009-0003736 | * | 1/2009 |
| KR | 2009-0003736 A | | 1/2009 |
| KR | 10-2010-0130379 | * | 12/2010 |
| KR | 2010-0130379 A | | 12/2010 |
| KR | 10-2011-0094196 | * | 8/2011 |
| KR | 2011-0094196 A | | 8/2011 |

OTHER PUBLICATIONS

International Search Report in International Application No. PCT/KR2014/003543, filed Apr. 23, 2014.

* cited by examiner

*Primary Examiner* — Leszek Kiliman
(74) *Attorney, Agent, or Firm* — Saliwanchik, Lloyd & Eisenschenk (57) ABSTRACT

The present invention relates to a method for preparing a nanostructure by electrochemical deposition, and a nanostructure prepared thereby, and more specifically, to: a method for preparing a nanostructure by electrochemical deposition, wherein it is possible to prepare a nanostructure having remarkable morphological, structural and optical characteristics by controlling a method for applied power during electrochemical deposition; and a nanostructure prepared thereby.

12 Claims, 10 Drawing Sheets

METHOD FOR PREPARING NANOSTRUCTURE BY ELECTROCHEMICAL DEPOSITION, AND NANOSTRUCTURE PREPARED THEREBY

CROSS-REFERENCE TO RELATED APPLICATIONS

This application is the U.S. national stage application of International Patent Application No. PCT/KR2014/003543, filed Apr. 23, 2014, which claims priority to Korean Application Nos. 10-2013-0044522, filed Apr. 23, 2013, and 10-2014-0033653, filed Mar. 21, 2014, the disclosures of each of which are incorporated herein by reference in their entirety.

TECHNICAL FIELD

The present invention relates to a method of preparing a nanostructure by electrochemical deposition, and a nanostructure prepared thereby, and more specifically, to a method of preparing a nanostructure by electrochemical deposition, in which a nanostructure having remarkable morphological, structural and optical characteristics may be prepared by controlling a power applying method during electrochemical deposition, and a nanostructure prepared using the method.

BACKGROUND ART

In the field of semiconductor technology, nano devices implemented by a bottom-up method based on nano synthesis and arrays have received much attention to overcome a current limitation in a process and to provide a new functionality.

Quantum dots having a zero-dimensional nano structure, and quantum wires, nanowires, or nanorods having a one-dimensional nano structure (hereinafter, the term "nanostructure" will be used as a common term for quantum wires, nanowires, nanorods, etc.) have been suggested as a nano material which can realize the possibility as described above Currently, Si, Ge, an Al—Ga—In—P—N system, ZnO, $SnO_2$, SiC, and the like are representative materials which have been widely studied domestically and abroad in order to form nanostructures such as semiconductor nanowires, nanorods, etc.

Particularly, zinc oxide (ZnO) which is a binary oxide semiconductor is a group 2-6 compound semiconductor having a wurtzite structure, and is a typical N-type semiconducting material having a wide energy band gap of 3.37 eV and a high exciton binding energy of 60 meV. Further, zinc oxide (ZnO) has various production processes and structures, and is easily doped and has a narrow conduction band, and thus, the electrical-optical characteristics of zinc oxide are easily controlled according to a doping material. Accordingly, zinc oxide has received a spotlight as a suitable material for manufacturing a variety of devices such as optical instruments, optical devices, solar cells, light-emitting diodes (LEDs) and the like, and there are diverse studies on zinc oxide in progress.

Up to now, in the studies on zinc oxide, much research on zinc oxide (ZnO) nanostructures has been performed using various processes. Examples of main process methods include atomic layer deposition, pulsed laser deposition, molecular beam epitaxy, metal organic chemical vapor deposition, sputtering, spin coating, hydrothermal deposition, electrochemical deposition, etc.

In the above-described process methods, the electrochemical deposition method is a very simple method of growing zinc oxide (ZnO) nanostructures, allows zinc oxide nanostructures to be grown at a low temperature and can increase the area of a substrate, can be applied to a diversity of substrates, and can directly control the thicknesses of nanostructures, and the electrochemical deposition method has an advantage of a low initial cost. Most research on the electrochemical deposition method until now have been focused on conditions for growing zinc oxide nanostructures, that is, a growth temperature, an electric potential, a deposition time, whether a heat treatment is performed or not, whether a seed buffer layer is formed or not, and whether an additive is used or not.

Indium tin oxide (ITO) is a representative transparent electrode, and has been widely used for solar cells, smart glasses (i.e., electrochromic devices), flat panel displays, gas sensors, transparent displays, etc. Particularly, a structure in which zinc oxide (ZnO) nanorods are grafted on an ITO layer can be applied to optical devices, that is, to light-emitting diodes (LEDs), solar cells or the like, and many studies on the above-described structure are currently in progress.

However, although the research results of the attempts of vertical growth using a template such as anodic aluminum oxide (AAO) or the like, a buffer layer, and an additive to grow zinc oxide (ZnO) nanorods in a perpendicular direction on an ITO layer have been reported, these methods have a problem in that the optical characteristics of the zinc oxide (ZnO) nanorods generated by adding the buffer layer, additive or the like are degraded.

Technical Problem

In order to address the conventional issue as described above, the present invention is directed to providing a method of preparing a nanostructure by electrochemical deposition in which no buffer layer is formed and no additive is used, and a nanostructure prepared using the method.

Technical Solution

In order to address the issue as described above, the present invention provides a method of preparing a nanostructure by electrochemical deposition, including: positioning a plurality of electrodes, which includes a working electrode, in a growth solution in an electrolytic deposition reactor; growing a first nanostructure on the working electrode by supplying a first applying power source between the electrodes for a first applying time and supplying oxygen/inert gas into the electrolytic deposition reactor; and growing a second nanostructure on the first nanostructure grown on the working electrode by supplying a second applying power source between the electrodes for a second applying time and supplying oxygen/inert gas into the electrolytic deposition reactor; and the first applying power source and the second applying power source are different from each other.

In a method of forming a nanostructure by electrochemical deposition according to an embodiment of the present invention, when an electric potential is applied to a substrate (working electrode) and a plurality of electrodes in a growth solution in the electrochemical deposition device, zinc oxide may be generated through the following chemical reaction in the growth solution, and the generated zinc oxide may be deposited on the substrate (working electrode) and grown to form nanorods.

[Chemical Reaction Formula]

$$Zn(NO_3)_2 \rightarrow Zn^{2+} + 2NO_3^-$$

$$NO_3^- + H_2O + 2e^- \rightarrow NO_2^- + 2OH^-$$

$$Zn^{2+} + 2OH^- \rightarrow Zn(OH)_2$$

$$Zn(OH)_2 \rightarrow ZnO + H_2O$$

According to the embodiment of the present invention, the size and height of the nanorods grown through the above-described process may be controlled to vary according to the applying method, the magnitude, and the applying time of an applying power source.

In the method of forming a nanostructure by electrochemical deposition according to the embodiment of the present invention, the working electrode may be a conductive substrate and a transparent substrate on which a transparent conductive film is formed, and a nanostructure may be grown on the conductive substrate.

In the method of forming a nanostructure by electrochemical deposition according to the embodiment of the present invention, the transparent substrate may be a glass substrate, and the transparent conductive film may be formed of a material selected from the group consisting of ITO, IZO, ATO, ZnO, CdO, $SnO_2$, and $In_2O_3$.

In the method of forming a nanostructure by electrochemical deposition according to the embodiment of the present invention, the plurality of electrodes may include a reference electrode, a counter electrode, and a working electrode, of which electric potentials are controlled by a constant electric potential controller, the reference electrode may be formed of Ag/AgCl, and the counter electrode may be formed of a metal material selected from the group consisting of Pt, Au, Zn, and Ag.

In the method of forming a nanostructure by electrochemical deposition according to the embodiment of the present invention, the first applying power source may be in the range of −0.8 to −1.2 V, and the first applying time may be in the range of 6 to 240 seconds.

In the method of forming a nanostructure by electrochemical deposition according to the embodiment of the present invention, the second applying power source may be in the range of −0.5 to −0.8 V and the second applying time may be in the range of 900 to 1,500 seconds.

In the method of forming a nanostructure by electrochemical deposition according to the embodiment of the present invention may further comprise applying additional applying power source n times (n is 1 or more) after applying the second applying power source.

In the method of forming a nanostructure by electrochemical deposition according to the embodiment of the present invention, the growth solution may be an electrolyte solution including metal salts, the metal is zinc (Zn), and the growth solution may be a $ZnCl_2$ or $Zn(NO_3)_2$ aqueous solution having a concentration in the range of 0.0001 to 0.01 M.

In the method of forming a nanostructure by electrochemical deposition according to the embodiment of the present invention, the growth solution may further include potassium chloride (KCl).

In the method of forming a nanostructure by electrochemical deposition according to the embodiment of the present invention, the growing of the first nanostructure and the growing of the second nanostructure may be performed at a temperature in the range of 80 to 100° C.

The method of forming a nanostructure by electrochemical deposition according to the embodiment of the present invention may further include performing a heat treatment at a temperature in the range of 250 to 350° C. after growing the second nanostructure. When the heat treatment process is further performed, $Zn(OH)_2$ may turn to ZnO, thereby showing an effect of increasing crystallinity.

Further, the present invention provides a nanostructure formed by the method of forming a nanostructure by electrochemical deposition according to the embodiment of the present invention.

The nanostructure formed by the method of forming a nanostructure by electrochemical deposition according to the embodiment of the present invention may be a zinc oxide nanorod.

The nanostructure according to the embodiment of the present invention may have an average diameter in the range of 50 to 160 nm.

Advantageous Effects

In the method of forming a nanostructure by electrochemical deposition according to the embodiment of the present invention, a buffer layer and an additive are not used, a power applying method is optimized in the electrochemical deposition, and thereby a nanostructure having excellent morphological, structural and optical characteristics can be prepared.

MODES OF THE INVENTION

Hereinafter, the present invention will be described in detail with reference to embodiments. However, the present invention is not limited to the following embodiments.

Example

Preparation of Zinc Oxide Nanostructure

A zinc oxide nanostructure was prepared using a potentiostat/galvanostat (Model PL-9 Physio Lab Co., Ltd., South Korea) as an electrochemical deposition device and using a three-electrode system. ITO/glass (sheet resistance: 10 Ω/sq) was used as a working electrode, a Pt-mesh was used as a counter electrode, Ag/AgCl (1 M KCl) was used as a reference electrode, and ITO/glass which was the working electrode was used after cleaning with ultrasonic waves in acetone, methanol, and deionized water for 10 minutes respectively, and drying with filtered air.

As an electrolyte solution in which a zinc oxide nanostructure is grown, 0.005 M $ZnCl_2$ (Sigma-Aldrich Co.

LLC., purity>98%) was used as a main electrolyte solution for $Zn^2$, and 0.1 M KCl (KANTO KAGAKU, purity>99.5%) was used as an auxiliary electrolyte solution. A bath temperature was set to 90° C., a mixed gas of $Ar/O_2$ which is an oxygen source was introduced into the solution for 10 minutes, and thereby an electrolyte solution saturated with the mixed gas of $Ar/O_2$ was prepared and used. A first applied electric potential and time, and a second applied electric potential and time were changed as shown in the following Table 1 such that total process time was 1,200 seconds, and thereby a zinc oxide nanostructure was synthesized.

After the electrochemical process, a heat treatment was performed at 300° C. under a nitrogen atmosphere for 1 hour using a rapid thermal process (RTP).

TABLE 1

| No | First-step potential (V) | Deposition time (s) | Second-step potential (V) | Deposition time (s) |
|---|---|---|---|---|
| 1 | −1.2 | 3 | −0.7 | 1197 |
| 2 | | 6 | | 1194 |
| 3 | | 10 | | 1190 |
| 4 | | 20 | | 1180 |
| 5 | | 60 | | 1140 |
| 6 | | 240 | | 960 |
| 7 | −1 | 10 | | 1190 |
| 8 | | 20 | | 1180 |
| 9 | | 60 | | 1140 |
| 10 | | 240 | | 960 |
| 11 | −0.8 | 10 | | 1190 |
| 12 | | 20 | | 1180 |
| 13 | | 60 | | 1140 |
| 14 | | 240 | | 960 |
| 15 | −0.6 | 10 | | 1190 |
| 16 | | 20 | | 1180 |
| 17 | | 60 | | 1140 |
| 18 | | 240 | | 960 |
| 19 | −0.4 | 10 | | 1190 |
| 20 | | 20 | | 1180 |
| 21 | | 60 | | 1140 |
| 22 | | 240 | | 960 |
| 23 | −0.2 | 10 | | 1190 |
| 24 | | 20 | | 1180 |
| 25 | | 60 | | 1140 |
| 26 | | 240 | | 960 |

Comparative Example

A zinc oxide nanostructure was grown while a constant voltage was applied for 1,200 seconds without a change in the voltage.

Experimental Example

Field Emission Scanning Electron Microscope (FE-SEM) Measurement

Figure 1:
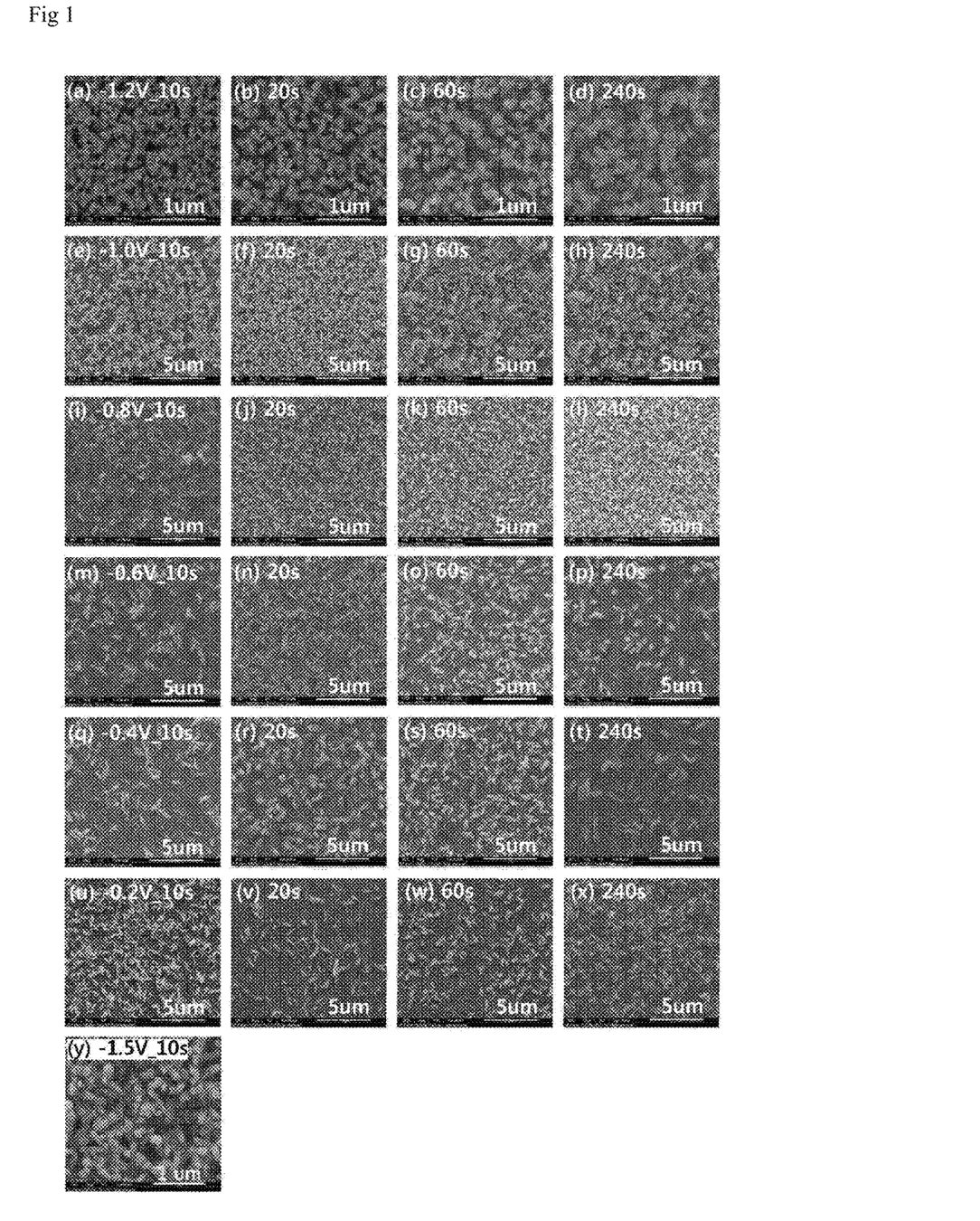
FIGS. 1 to 3 show FE-SEM measurement results of nanostructures prepared according to Examples of an embodiment of the present invention and Comparative Examples.
Figure 2:
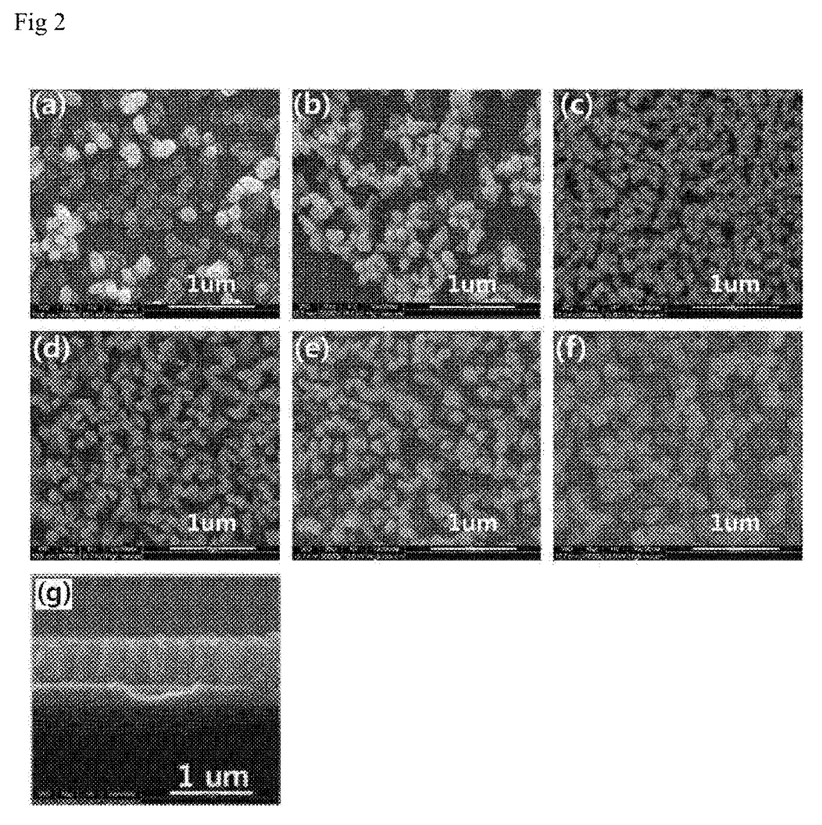
Figure 3:
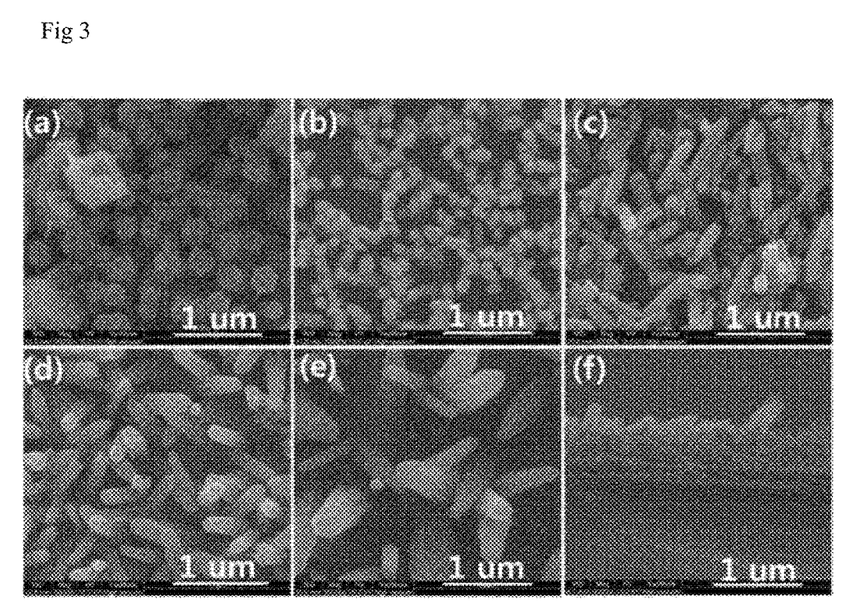

FE-SEM pictures were taken to determine the morphological characteristics of the zinc oxide nanostructure according to the magnitude and the applying time of the first applied voltage, and are shown in FIGS. 1 to 3.

FIG. 1 shows FE-SEM pictures of the zinc oxide nanostructure prepared while the amount and applying time of the first applied voltage were changed, where FIGS. 1(A) to 1(X) show the zinc oxide nanostructures prepared while the first applied voltages of −1.2, −1.0, −0.8, −0.6, −0.4, and −0.2 V were applied for 10, 20, 60, and 240 seconds each, and then the second applied voltages of −0.7 V were applied for 1190, 1180, 1140, and 960 seconds each, and FIG. 1(Y) shows the zinc oxide nanostructures prepared while the first applied voltage of −1.5 V was applied for 10 seconds, and then the second applied voltage of −0.7 V was applied for 1,190 seconds.

As shown in FIG. 1, when the first applied voltage is −0.8 V or more, it may be determined that the zinc oxide nanostructures having a high density were prepared. This is because the electron density of the surface of the substrate (working electrode), which is required to form an instantaneous nucleation site, was sufficiently supplied when a voltage of −0.8 V or more was applied.

When the second applied voltage of −0.7 V was applied for 1,190 seconds after the first applied voltage of −1.5 V was applied for 10 seconds, a zinc oxide nanostructure having a hexagonal crystal structure was grown. However, when the first applied voltage was applied for 20 seconds or more, a reference electrode was ruined.

In FIG. 2, FIGS. 2(A) to 2(F) show top-views of zinc oxide nanostructures prepared while the first applied voltage of −1.2 V was applied for 3, 6, 10, 20, 60, and 240 seconds each, and then the second applied voltage of −0.7 V was applied for 1197, 1194, 1190, 1180, 1140, and 960 seconds each, and FIG. 2(G) shows cross-sectional views of zinc oxide nanostructures prepared while the first applied voltage of −1.2 V was applied for 10 seconds, and then the second applied voltage of −0.7 V was applied for 1,190 seconds.

As shown in FIG. 2, when the zinc oxide nanostructures were prepared while the first applied voltage of −1.2 V was applied for 10 seconds, and then the second applied voltage of −0.7 V was applied for 1,190 seconds, it may be determined that the zinc oxide nanostructures having a height of about 550 nm were grown.

FIG. 3 shows a result of FE-SEM picture measurement of zinc oxide nanostructures prepared in Comparative Example, FIGS. 3(A) to 3(E) show top-views of zinc oxide nanostructures prepared while applied voltages of −1.2, −1.0, −0.8, −0.7, and −0.6 V were applied continuously for 1,200 seconds each, and FIG. 3(F) shows cross-sectional views of zinc oxide nanostructures prepared while the applied voltage of −0.7 V was applied.

As shown in FIG. 3, when the constant amount of the applied voltage was continuously applied, it may be determined that the zinc oxide nanostructures were not grown to be perpendicular.

Experimental Example

Measurement of Diameter and Density of Nanostructure

Figure 4:
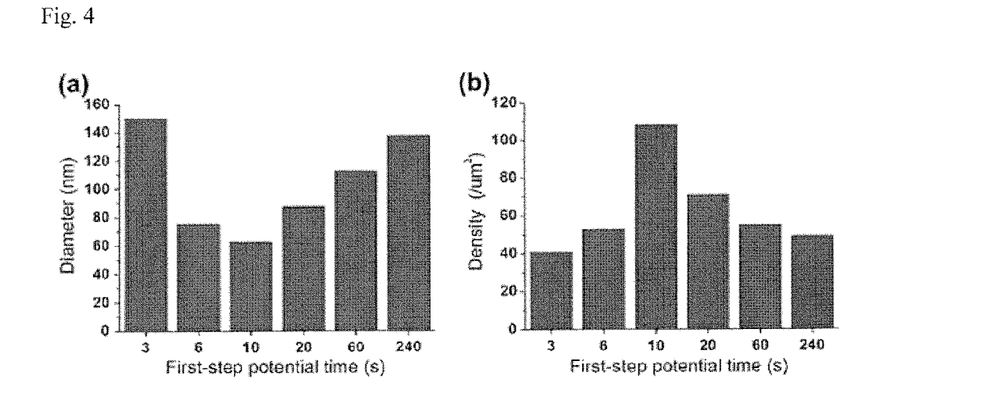
FIG. 4 shows measurement results of the diameter and density of a nanostructure prepared according to an embodiment of the present invention.

The diameter and density of the zinc oxide nanostructures prepared while the first applied voltage of −1.2 V was applied for 3, 6, 10, 20, 60, and 240 seconds each, and then the second applied voltages of −0.7 V was applied for 1197, 1194, 1190, 1180, 1140, and 960 seconds each, were measured using FE-SEM pictures in FIG. 2, and are shown in FIG. 4.

As shown in FIG. 4, when the applying time of the first applied voltage increased, the diameter of the zinc oxide nanostructures had a tendency to decrease and then increase again, and when the applying time of the first applied voltage increased, the density of the zinc oxide nanostructures had a tendency to increase and then decrease again. From these results, it may be determined that the diameter and density of the zinc oxide nanostructures showed an opposite tendency as the applying time of the first applied voltage increased.

Experimental Example

X-Ray Diffraction Analysis (XRD)

Figure 5:
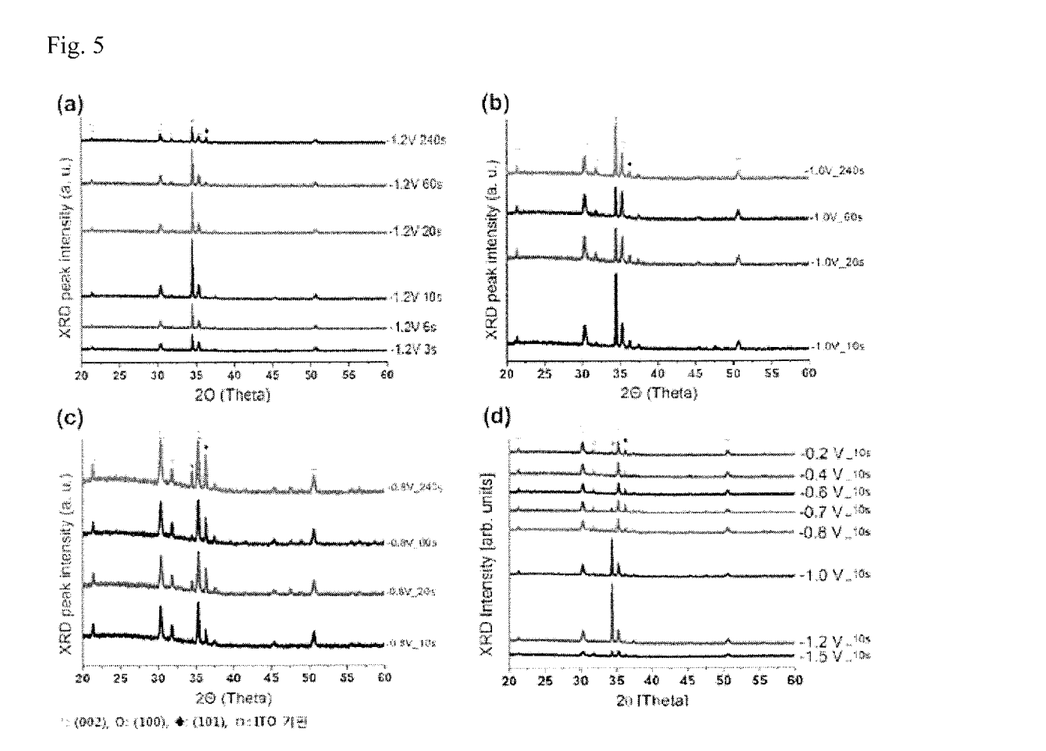
FIGS. 5 and 6 show XRD measurement results of a nanostructure prepared according to the embodiment of the present invention.
Figure 6:
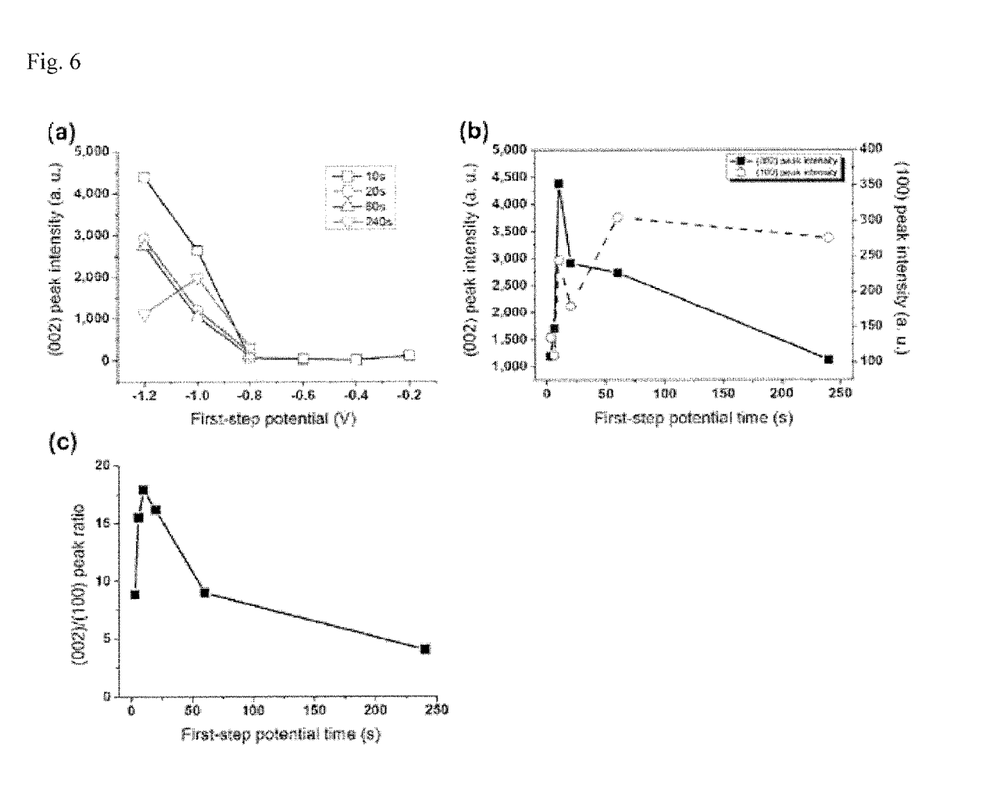

An XRD was measured to determine the structural characteristics of the zinc oxide nanostructure, and results are shown in FIGS. 5 and 6.

FIG. 5(A) is a result of an XRD measurement of zinc oxide nanostructures prepared while the first applied voltage of −1.2 V was applied while the applying time was changing from 3 to 240 seconds, and then the second applied voltage of −0.7 V was applied while the applying time was changing from 1,197 to 960 seconds. FIGS. 5(B) and 5(C) are results of an XRD measurement of zinc oxide nanostructures prepared while the application of the first applied voltage was changing from −1.0 to −0.8 V while the applying time was changing from 10 to 240 seconds, and then the second applied voltage of −0.7 V was applied while the applying time was changing from 1,190 to 960 seconds. FIG. 5(D) is a result of an XRD measurement of zinc oxide nanostructures prepared while the application of the first applied voltage was changing from −0.2 to −1.5 V while applied for 10 seconds, and then the second applied voltage of −0.7 V was applied for 1,190 seconds.

As shown in FIG. 5, the zinc oxide nanostructures according to the embodiment of the present invention showed (100) peaks at 31°, and thus, it may be determined that all the zinc oxide nanostructures included polycrystalline zinc oxide nanorods.

FIG. 6 shows a result of a measurement of a (002) peak intensity at 34°, a (100) peak intensity at 31°, and the intensity ratio between (002)/(100) peaks according to the amount and the applying time of the first applied voltage.

As shown in FIG. 6(A), it may be determined that, when the first applied voltage was −0.8 V or more, the (002) peak intensity increased, and when the applying time was 10 seconds, the highest peak strength was shown.

FIGS. 6(B) and 6(C) show the (002) peak intensity, the (100) peak intensity, and the intensity ratio between (002)/(100) peaks of the nanostructures prepared while the first applied voltage of −1.2 V was applied and the applying time was changed, and it may be determined that the peak strength of (002) peak increased until 10 seconds, but the peak strength of (002) peak decreased after 10 seconds. This is because the electron density to form an instantaneous nucleation site was insufficient until 10 seconds, but the electron density was excessive after 10 seconds. The greater the intensity ratio between (002)/(100) peaks is, the more nanorods were grown in a c-axis direction which is in a direction perpendicular to a substrate, and it may be determined that the intensity ratio between (002)/(100) peaks also had a tendency to increase until 10 seconds, but decrease after 10 seconds.

Experimental Example

Measurement of Optical Properties According to First Applied Voltage

Figure 7:
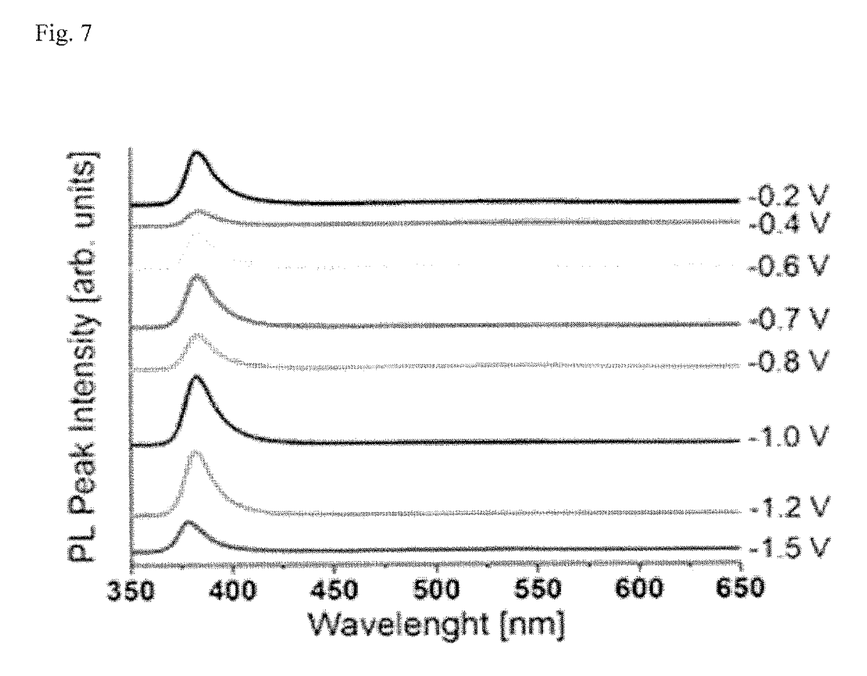
FIGS. 7 to 10 show photoluminescence (PL) measurement results of a nanostructure prepared according to the embodiment of the present invention.

The photo luminescence (PL) characteristics of zinc oxide nanostructures prepared while the first applied voltage was changing from −0.2 to −1.5 V was applied for the constant applying time of 10 seconds, and then the second applied voltage of −0.7 V was applied for 1,190 seconds were measured and are shown in FIG. 7. The intensity of a weak near-band edge emission (NBE) peak positioned in an ultraviolet region, the intensity of a strong deep-level emission (DLE) peak positioned in a visible region, and the intensity ratio between the NBE and DLE peaks are shown in FIG. 8.

In general, the NBE peak results from free exciton recombination, and the DLE peak results from defects such as oxygen vacancy, zinc vacancy, interstitial oxygen, and interstitial zinc.

Figure 8:
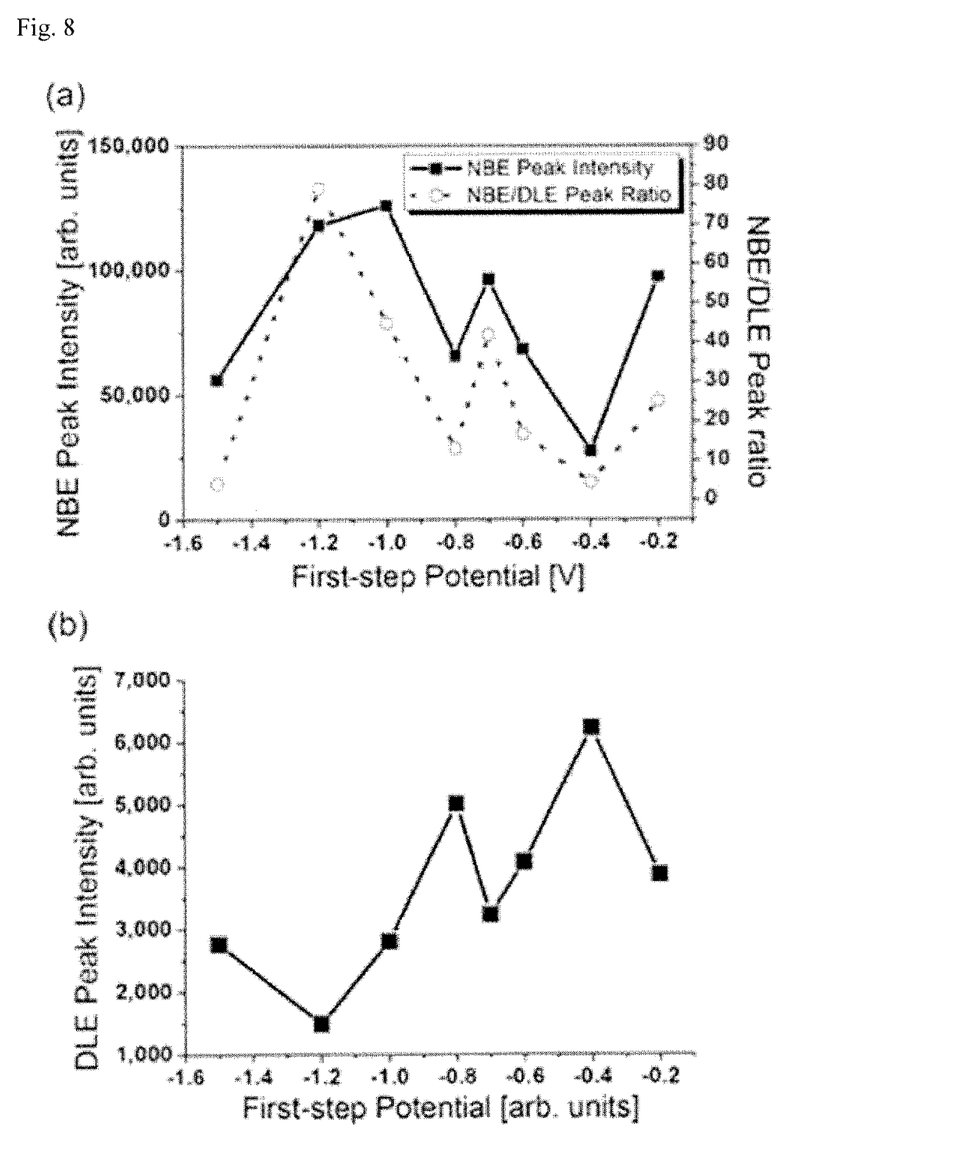

As shown in FIG. 8(A), the NBE peak intensity when the first applied voltage of −1.0 V was applied was 126,101, which was higher than the intensity of the NBE peak when the first applied voltage of −1.2 V was applied (118,170), and the DLE peak intensity was also measured to be higher when the first applied voltage of −1.0 V was applied, and accordingly, the value of the intensity ratio between the NBE and DLE peaks are shown to be highest when the first applied voltage of −1.2 V was applied. As shown in FIGS. 8(A) and 8(B), when the first applied voltages of −1.5, −1.2, −1.0, −0.8, −0.7, −0.6, −0.4, and −0.2 V were applied, the intensity values of the DLE peak were respectively 2,767, 1,491, 2,808, 5,020, 3,240, 4,087, 6,230, and 3,874, and thus, it may be determined that the intensity value of the DLE peak was lowest when the first applied voltages of −1.2 V was applied. The values of the intensity ratio between NBE/DLE peaks were respectively 4.2, 79.26, 44.92, 13.11, 41.95, 16.72, 4.44, and 25.18 when the above-described values of the first applied voltages were applied, and thus, it may be determined that the intensity ratio between NBE/DLE peaks was highest when the first applied voltages of −1.2 V was applied.

Experimental Example

Figure 9:
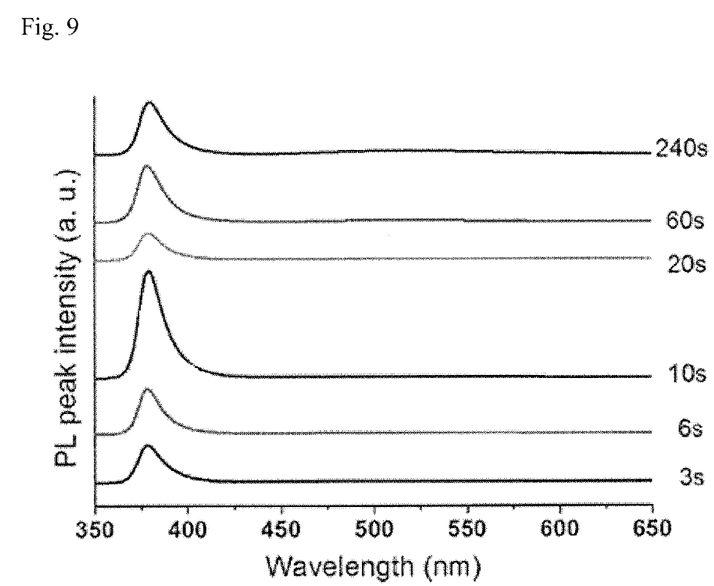

Measurement of Optical Properties According to Applying Time of First Applied Voltage The photo luminescence (PL) characteristics of the zinc oxide nanostructures prepared while the constant first applied voltage of −1.2 V was applied while the applying time was changing from 3 to 240 seconds, and then the second applied voltage of −0.7 V was applied while the applying time was changing from 1,197 to 960 seconds were measured and are shown in FIG. 9. The NBE peak intensity, the DLE peak intensity, and the intensity ratio between the NBE and DLE peaks are shown in FIG. 10.

Figure 10:
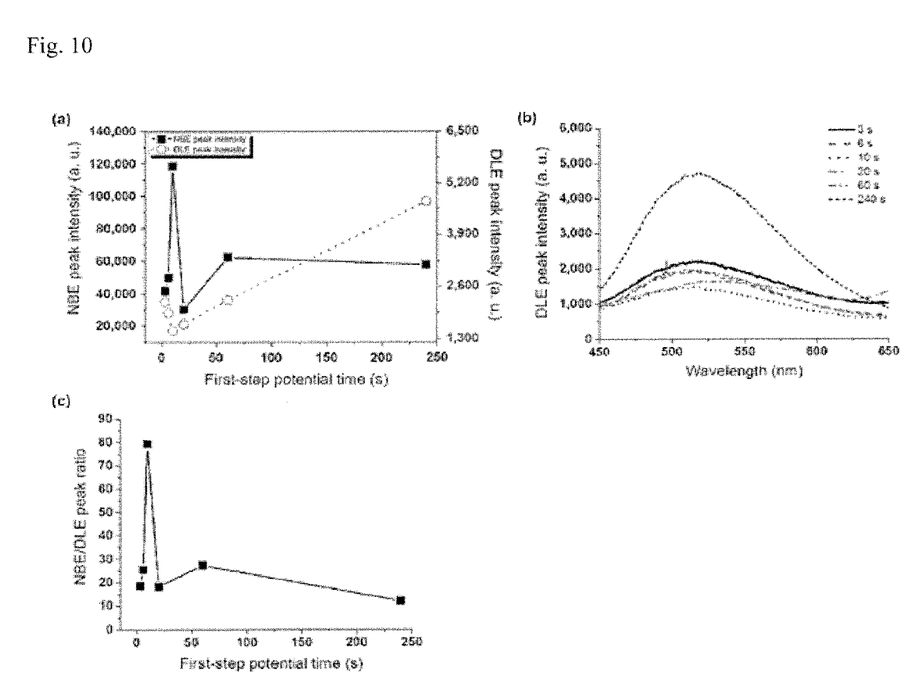

As shown in FIG. 10, when the applying times were 3, 6, 10, 20, 60, and 240 seconds, the values of the NBE peak intensity were respectively 41,611, 49,764, 118,170, 30,320, 62,128, and 57,821, and thus, it may be determined that the intensity value of the NBE peak was highest when the applying time was 10 seconds. The values of the DLE peak intensity were respectively 2,219, 1,942, 1,490, 1,653, 2,270, and 4,733 when the above-described applying times were used, and thus, it may be determined that the value of the DLE peak intensity was lowest when the applying time was 10 seconds. Further, the values of the intensity ratio between the NBE and DLE peaks were respectively 18.8, 25.7, 76.3, 18.4, 27.4, and 12.3 when the above-described applying times were used, and thus, it may be determined that the value of the intensity ratio between the NBE and DLE peaks was highest when the applying time was 10 seconds.

INDUSTRIAL APPLICABILITY

In the method of preparing a nanostructure by electrochemical deposition according to the embodiment of the present invention, a buffer layer and an additive are not used, a power applying method is optimized in electrochemical deposition, and thereby a nanostructure having excellent morphological, structural and optical characteristics can be prepared.

The invention claimed is:

1. A method of forming a nanostructure by electrochemical deposition, comprising:
    positioning a plurality of electrodes which includes a working electrode in a growth solution in an electrolytic deposition reactor;
    growing a first nanostructure on the working electrode by supplying a first applying power source between the plurality of electrodes for a first applying time and supplying oxygen/inert gas into the electrolytic deposition reactor; and
    growing a second nanostructure on the first nanostructure grown on the working electrode by supplying a second applying power source between the plurality of electrodes for a second applying time and supplying oxygen/inert gas into the electrolytic deposition reactor,
    wherein the first applying power source and the second applying power source are different from each other,
    wherein the first applying power source is in a range of −0.8 to −1.2 V and the first applying time is in a range of 6 to 240 seconds,
    wherein the second applying power source is in a range of −0.5 to −0.8 V and the second applying time is in a range of 900 to 1,500 seconds, and
    wherein the growing of the first nanostructure and the growing of the second nanostructure are performed at a temperature in a range of 80 to 100° C.

2. The method of claim 1, wherein the working electrode is a conductive substrate, and is a transparent substrate on which a transparent conductive film is formed.

3. The method of claim 2, wherein the transparent substrate is a glass substrate, and the transparent conductive film is formed of a material selected from the group consisting of ITO, ILO, ATO, ZnO, CdO, $SnO_2$, and $In_2O_3$.

4. The method of claim 1, wherein the plurality of electrodes include a reference electrode, a counter electrode, and the working electrode, and the reference electrode is formed of Ag/AgCl and the counter electrode is formed of a material selected from the group consisting of Pt, Au, Zn, and Ag.

5. The method of claim 1, wherein the growth solution is an electrolyte solution including metal salts, and the metal is zinc (Zn).

6. The method of claim 5, wherein the growth solution is a $ZnCl_2$ or $Zn(NO_3)_2$ aqueous solution having a concentration in a range of 0.0001 to 0.01 M.

7. The method of claim 6, wherein the growth solution further includes potassium chloride (KCl).

8. The method of claim 1, further comprising performing a heat treatment at a temperature in a range of 250 to 350° C. after growing the second nanostructure.

9. The method of claim 1, further comprising applying additional applying power source n times (n is 1 or more) after applying the second applying power source.

10. A nanostructure prepared by the method of claim 1.

11. The nanostructure of claim 10, wherein the nanostructure is a zinc oxide nanorod.

12. The nanostructure of claim 10, wherein the nanostructure has an average diameter in a range of 50 to 160 nm.

* * * * *